United States Patent [19]
Young

[11] Patent Number: 5,930,609
[45] Date of Patent: Jul. 27, 1999

[54] ELECTRONIC DEVICE MANUFACTURE

[75] Inventor: Nigel D. Young, Redhill, United Kingdom

[73] Assignee: U.S. Philips Corporation, New York, N.Y.

[21] Appl. No.: 08/818,691

[22] Filed: Mar. 19, 1997

[30] Foreign Application Priority Data

Mar. 22, 1996 [GB] United Kingdom .................... 9606083

[51] Int. Cl.$^6$ ........................ H01L 21/338; H01L 21/336
[52] U.S. Cl. ............................................ 438/166; 438/308
[58] Field of Search ..................................... 438/166, 308

[56] References Cited

U.S. PATENT DOCUMENTS

| | | |
|---|---|---|
| 4,587,720 | 5/1986 | Chenevas-Paule . |
| 5,130,829 | 7/1992 | Shannon ..................................... 359/59 |
| 5,851,862 | 12/1998 | Ohtani et al. . |
| 5,854,096 | 12/1998 | Ohtani et al. . |

FOREIGN PATENT DOCUMENTS

| | | |
|---|---|---|
| 0422864B1 | 4/1991 | European Pat. Off. . |
| 6140321 | 5/1994 | Japan . |
| 6140323 | 5/1994 | Japan . |
| 6140324 | 5/1994 | Japan . |

OTHER PUBLICATIONS

IEE Proc Circuits, Devices Syst. vol. 141, No. 1, Feb., 1994, pp. 27–32, Photocurrents in Poly–Si TFTS, J.R. Ayres, S.D. Brotherton, I.R. Clarence, P.J. Dobson.

Optoelectronics–Devices and Technologies, vol. 7, No. 2 pp. 301–320, Dec., 1992, J.R. Ayres, S.D. Brotherton, N.D. Young.

Primary Examiner—John F. Niebling
Assistant Examiner—Josetta Jones

[57] ABSTRACT

In the manufacture of a large-area electronic device, thin-film circuit elements such as TFTs are formed with separate islands (1a,1b) of a crystallized semiconductor film (1) on a device substrate (100,101). The method includes directing an energy beam (50) towards a grid (30) of masking stripes (32) and apertures (31) formed on the semiconductor film (1), to heat the semiconductor film (1) so as to crystallize it both at the apertures (31) and under the masking stripes (32). The masking stripes (32) are located over areas of the semiconductor film (1) where channel regions (11) of the TFT are to be formed. Each aperture (31) between the masking stripes (32) has a width (S1) of less than the wavelength ($\lambda$) of the energy beam (50) of step (c). The length of the channel region (11) below each masking stripe (32) is crystallized by diffraction of the energy beam (50) at the apertures as well as by thermal diffusion from the areas heated by the energy beam (50). The method also includes implanting dopant ions (40) in the semiconductor film (1) at the apertures (31) while using the masking stripes (32) to mask underlying areas against implantation, thereby providing a dopant concentration for source and drain regions (12) and (13) and intermediate conductive regions (14) of the TFT. At least part of the grid (30) of masking stripes (32) on the insulating film 2 is retained as an insulated gate structure of the TFT. Such a method simplifies the manufacturing process by combining steps for crystallizing the semiconductor film (1) and for forming the TFT structure, and the crystallizing process is rendered more efficient by appropriate choice of the material and dimensions of the grid (30), its apertures (31) and masking stripes (32).

10 Claims, 4 Drawing Sheets

ELECTRONIC DEVICE MANUFACTURE

This invention relates to methods of manufacturing an electronic device comprising a thin-film transistor, in which an energy beam (for example, from an excimer laser) is used to promote crystal growth in a semiconductor film on a substrate of the device. The device may be a large area image sensor, or a flat panel display (for example, a liquid crystal display), or several other types of large-area electronic device (for example a thin-film data store or memory device, or a thermal imaging device). The invention also relates to devices manufactured by such methods.

There is currently much interest in developing thin-film circuits with thin-film transistors (hereinafter termed "TFTs") and/or other semiconductor circuit elements on inexpensive insulating substrates for large area electronics applications. These circuit elements fabricated with separate semiconductor islands of an amorphous or polycrystalline semiconductor film (typically silicon) may form the switching elements in a cell matrix, for example in a flat panel display as described in U.S. Pat. No. 5,130,829 (our reference PHB 33646), the whole contents of which are hereby incorporated herein as reference material.

Recent developments involve the fabrication and integration of thin-film circuits (usually with polycrystalline silicon) as, for example, integrated drive circuits for such a cell matrix. In order to increase the circuit speed, it is advantageous to use semiconductor material of good crystal quality and high mobility for thin-film islands of the TFTs of these circuits. However, it is often desirable to form TFTs of the matrix with amorphous or micro-crystalline material, so that these matrix TFTs have only low leakage currents. Instead of needing to deposit two semiconductor films of different crystallinity, it is known to form the area of high crystallinity by exposing an area of a common film to an energy beam, usually from a laser. Such a process for forming polycrystalline silicon TFTs is disclosed in the paper "Low Temperature Poly-Si For Liquid Crystal Display Addressing" by J R Ayres et al in Optoelectronics—Devices and Technologies, Vol 7, No 2, pp 301–320 (Mita Press), the whole contents of which are hereby incorporated herein as reference material.

A modification of such a laser crystallisation process is proposed in published Japanese Patent Application Kokai JP-A-06-140321, the whole contents of which are hereby incorporated herein as reference material. JP-A-06-140321 proposes a method of manufacturing an electronic device comprising a thin-film transistor, the method including the steps of:

(a) depositing sequentially on a substrate a semiconductor film, an insulating film and a masking film;

(b) patterning the masking film to form a grid of masking stripes having apertures over the semiconductor film; and (c) directing an energy beam towards the grid and its apertures to heat the semiconductor film with the area of the energy beam at the apertures and so to crystallise the semiconductor film both at the apertures and under the masking stripes.

As disclosed in JP-A-06-140321, the masking stripes may be a laser reflecting film of, for example, chromium, and the energy beam may be an XeCl excimer laser of wavelength 308 nm. These masking stripes mask the semiconductor film against the area of the energy beam incident on the masking stripes. The stripes and apertures may each have a width of a few micrometers. The silicon film exposed to this laser beam at the apertures in the masking grid reaches a high temperature, whereas the areas of the silicon film masked by the masking stripes is at a lower temperature. The resulting temperature distribution is of alternating high and low temperature areas along the silicon film. The widths of each of the high and low temperature areas is a few micrometers. It is taught in JP-A-06-140321 that crystal grains grown in the high temperature areas propagate into the low temperature areas so forming a large crystal grain size in the silicon film. After crystallising the semiconductor film in this manner, both the masking grid and the insulating film are removed, after which the crystallised semiconductor film is further processed in known manner to provide a TFT structure.

It may be noted that JP-A-06-140321 is one of a group of Japanese patent applications filed on the same day and teaching the formation and use of such a temperature distribution of alternating high and low temperature areas for the formation of large crystal grain sizes. JP-A-06-140323 avoids the use of a thin-film masking grid on the semiconductor film by using instead a diffractive optical element which is in the form of a separate plate with two parallel slits and which is spaced at a distance from the semiconductor film. The laser light passing through the two slits is diffracted to form convex cylindrical wavefronts which then interfere with each other at the distant location of the semiconductor film, the interference pattern producing the desired temperature distribution of alternating high and low temperature areas in the film. In JP-A-06-140324, the use of a thin-film masking grid on the semiconductor film is avoided by providing instead the semiconductor film on a pattern of alternating silicon nitride and silicon oxide stripes. Due to the different thermal properties of silicon nitride and silicon oxide, the temperature of the areas of the silicon film on the silicon nitride becomes lower than that on the silicon oxide, so providing the desired temperature distribution of alternating high and low temperature areas in the semiconductor film.

It is an aim of the present invention to provide a method of manufacturing an electronic device in which the process for crystallising the semiconductor film is more efficient and in which the further manufacturing steps for forming the thin-film transistor are reduced in number.

According to the present invention there is provided a method of manufacturing an electronic device comprising a thin-film transistor, the method including the steps of:

(a) depositing sequentially on a substrate a semiconductor film, an insulating film and a masking film, (b) patterning the masking film to form a grid of masking stripes having apertures over the semiconductor film, (c) directing an energy beam towards the grid and its apertures to heat the semiconductor film with the area of the energy beam at the apertures and so to crystallise the semiconductor film both at the apertures and under the masking stripes, which method is characterised by so patterning the grid in step (b) as to locate the masking stripes over areas of the semiconductor film where channel regions of the thin-film transistor are to be formed and to give each aperture between the masking stripes a width of less than the wavelength of the energy beam of step (c) so as to crystallise the channel region below each masking stripe by diffraction of the energy beam at the apertures and by thermal diffusion from the areas heated by the energy beam, (d) implanting dopant ions characteristic of one conductivity type in the semiconductor film at the apertures in the grid while using the masking stripes to mask underlying areas of the semiconductor film against implantation of the dopant ions, the implanted dopant ions in the semiconductor film providing a conductivity type determining dopant concentration for source and drain regions and for intermediate conductive regions of the thin-film transistor, and (e) retaining at least part of the grid of masking stripes on the insulating film as an insulated gate structure of the thin-film transistor.

In such a method in accordance with the present invention the material and thickness of the insulating film and the material and dimensions of the masking grid are chosen so as to be compatible with the desired insulated gate structure of the thin-film transistor to be manufactured, as well as to function as a dopant ion implantation mask and to provide efficient crystallisation of the semiconductor film with the energy beam. In general, the dimensions chosen for the widths of the masking stripes and apertures will be significantly less (typically an order of magnitude less) than the corresponding dimensions in the prior art method of JP-A-06-140321. Thus, for example, each aperture of the masking grid in accordance with the present invention has a width of less than the wavelength of the energy beam, typically of ultraviolet wavelength from an excimer laser, for example a wavelength of 248 nm (0.248 $\mu$m) from a KrF laser, a wavelength of 308 nm (0.308 $\mu$m) from a XeCl laser, or a wavelength of 351 nm (0.351 $\mu$m) from a XeF laser. By using smaller dimensions than JP-A-06-140321 a more efficient crystal growth can be achieved. Because the width of each aperture of the grid in accordance with the present invention is less than the wavelength of the energy beam, diffraction of the energy beam occurs within the semiconductor film at each aperture. Crystal growth under the masking stripes is aided by both this diffraction of the energy beam below the masking stripe and by heat flow by thermal diffusion in the thin-film structure. Furthermore, the manufacture of the TFT is simplified by using the grid of masking stripes on the insulating film as the insulated gate structure of the TFT, so avoiding additional deposition and photolithographic and etching steps for the formation of this insulated gate structure.

The resulting TFT structure can also have advantageous characteristics. Thus, for example, the channel regions are self-aligned with the insulated gate structure so minimising overlap capacitances between the insulated gate structure and the source, drain and intermediate regions. The apertures in the insulated gate structure permit an efficient hydrogenation of the channel regions of the TFT when exposing the TFT structure to a hydrogen-containing atmosphere, for example a hydrogen plasma. A sub-divided but long channel length of the TFT also improves the TFT output characteristics, for example in reducing leakage current through the TFT in its off state. Thus, a TFT manufactured in accordance with the invention can avoid both of the channel-length dependency problems described in the Optoelectronics paper by J R Ayres, in which the effectiveness of hydrogenation reduces with increasing channel length (FIG. 8) under a single gate finger and the output characteristics degrade with reducing channel length.

In order to reduce the dark current it is known from, for example, the paper "Photocurrents in Poly-Si TFTs" by J R Ayres et al in IEE Proc Circuits Devices Systems, Vol 141, No 1, February 1994, pp 27–32 to divide the gate/channel of a self-aligned TFT into a number of fingers, for example six fingers each of 6 $\mu$m width. The whole contents of the IEE Proc Circuits Devices Systems paper are hereby incorporated herein as reference material. By contrast herewith, the TFT fabricated in accordance with the present invention has a multi-fingered gate structure which is also designed for the laser crystallisation of the semiconductor film and which typically has a larger number of fingers of smaller widths than those described in the IEE Proc Circuits Devices Systems paper.

The dopant concentration implanted in step (d) may be annealed in a separate heating step from the crystal growth step (c). Thus, the implantation step (d) may be carried out either before or after the crystal growth step (c). However, in order to simplify the manufacturing process by reducing the number of process steps, it is advantageous to carry out the implantation step (d) before the crystal growth step (c), and to use the energy beam in step (c) to anneal the implanted dopant concentration at the apertures as well as crystallising the semiconductor film both at the apertures and under the masking stripes. Surprisingly, it is found that this annealing of the implanted dopant concentration can be carried out during the crystal growth step (c) without any significant diffusion of the implanted dopant concentration.

It may be noted that it is known from published European Patent Application EP-A 0 422 864 to implant constituent ions (for example silicon ions of a semiconductor film) into the film through apertures of a mask pattern (for example of photoresist) to produce amorphous areas at these apertures and then by solid phase crystallisation to re-crystallise the areas at the apertures into large size crystal grains through crystal growth from crystalline areas masked by the masking pattern. Such a process is in many respects the very opposite of a process in accordance with the present invention, in which the crystal growth is from the implanted areas at the apertures to the less crystalline areas below the masking stripes. The presence of the implanted dopant in the film areas at the apertures does not inhibit the start of crystal growth in these areas heated by the energy beam nor the spread of that crystal growth to the areas under the masking stripes.

Although the masking film is patterned into a grid, the underlying insulating film may be kept as a continuous film on the semiconductor film during the crystal growth and implantation steps (c) and (d). However, there are advantages in removing the insulating film from the apertures of the grid before the crystal growth and implantation steps (c) and (d). Thus, for example, if the insulating film is present at the apertures during the implantation step (d), a higher energy for the implanted ions is required to penetrate to the desired depths in the semiconductor film. Although the edges of the implanted areas are self-aligned with the edges of the masking stripes (due to the directional nature of the ion beam), there is a small sideways scattering of the implanted ions below the edge of the masking stripe. This sideways scattering increases with increasing ion energy. Hence it is advantageous to keep the ion energy low and so not to have the insulating film present at the apertures during the implantation step. If the insulating film is present on the semiconductor film at the apertures during the crystal growth step (c), a slight roughening of the semiconductor surface at these apertures is found to occur. To avoid this roughening, it is advantageous to remove the insulating film from the apertures before the crystal growth step (c). Furthermore, by so patterning the insulating film before the crystal growth step (c), a refractive side-wall of the insulating film is formed at the sides of each aperture. This refractive side-wall can elongate the spread of the diffraction peak along the semiconductor film below the masking stripe so further aiding crystal growth in this area.

The masking stripes will normally be of such a material and thickness that they mask the semiconductor film against the area of the energy beam incident on the masking stripes. It is advantageous for the masking stripes to be of a material (for example a semiconductor material) which absorbs the energy beam incident thereon. Thus, the masking stripes may be heated by the absorbed energy beam and may aid the crystal growth in the underlying semiconductor film by heat diffusion across the intermediate insulating film. At a beam wavelength of 248 nm, for example, the masking stripes may be of silicon so as to be highly absorbing, or of chromium so as to be partly absorbing and partly reflective, or of aluminium so as to be highly reflective. The masking stripes may even be partially transmissive of the energy beam, and this partial transmission may also aid crystal growth in the underlying semiconductor film area by absorption therein. Thus, for example, indium tin oxide (ITO) is a commonly used electrode material in large-area electronic device comprising thin-film circuitry, and an insulated gate structure of ITO may be as much as 70% transmissive of a 351 nm wavelength energy beam.

These and other features in accordance with the present invention, and their advantages, are illustrated specifically in embodiments of the invention now to be described, by way of example, with reference to the accompanying diagrammatic drawings, in which.

Figure 1:
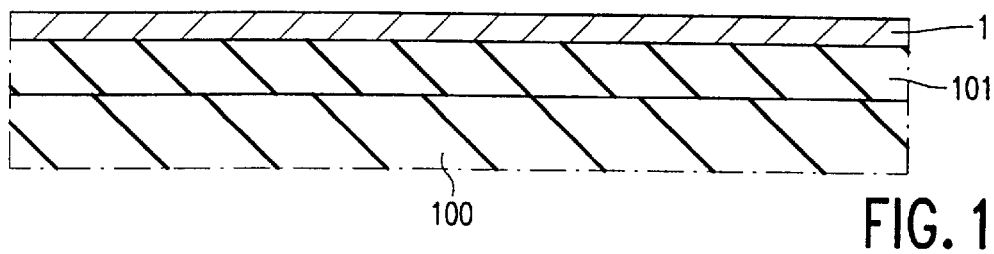
FIGS. 1 to 6 are cross-sectional views of part of an electronic device structure at successive stages in its manufacture by a method in accordance with the present invention, FIGS. 6a and 6b showing alternative forms of a metallisation pattern for the source and drain of a TFT manufactured in that method.

It should be understood that all the Figures are diagrammatic and not drawn to scale. Relative dimensions and proportions of parts of the cross-sectional views and plan views have been shown exaggerated or reduced in size for the sake of clarity and convenience in the drawings. The same reference signs are generally used to refer to corresponding or similar features in different embodiments.

Figure 4:
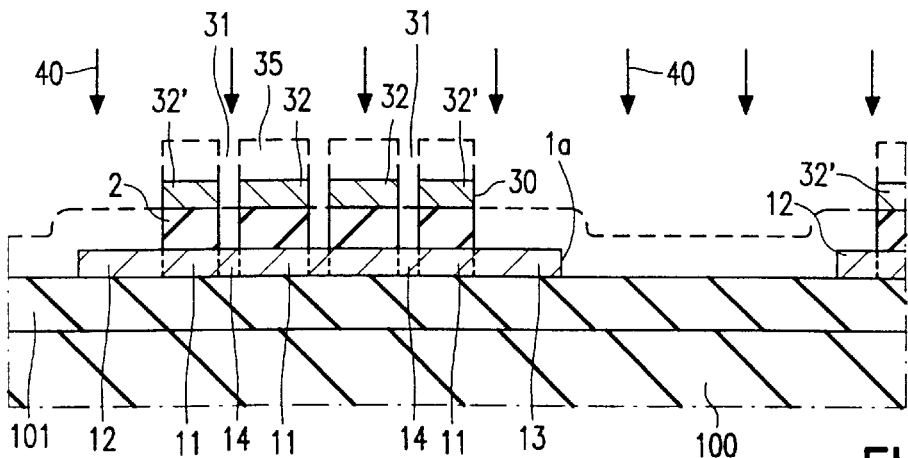
Figure 5:
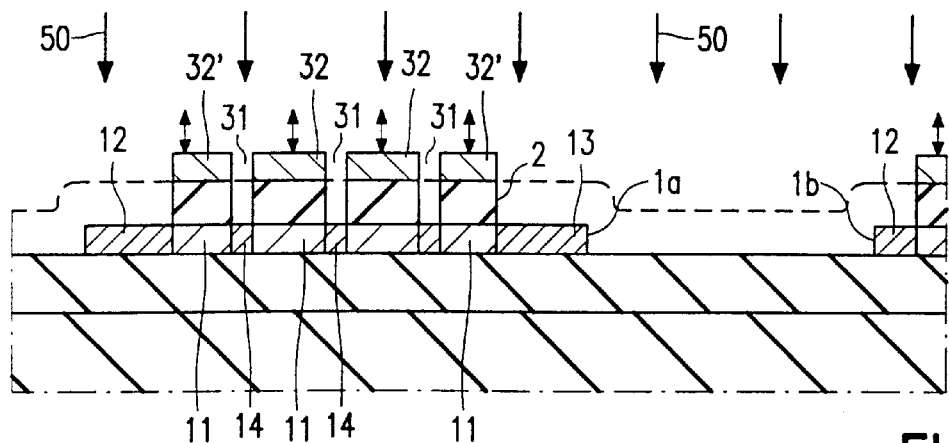

FIGS. 1 to 7 illustrate stages in the manufacture of a large-area electronic device comprising thin-film circuitry with circuit elements such as thin-film transistors (TFTs). These circuit elements are formed with separate islands (such as silicon islands 1a and 1b) of a semiconductor film 1 on a device substrate 100,101. The method includes the steps of:

(a) depositing sequentially on the substrate 100,101 a semiconductor film 1, an insulating film 2 and a masking film 3 (FIGS. 1 and 2), (b) patterning the masking film 3 to form a grid 30 of masking stripes 32 having apertures 31 over the semiconductor film 1 (FIGS. 3 and 4), and (c) directing an energy beam 50 towards the grid 30 and its apertures 31 to heat the semiconductor film 1 with the area of the beam 50 at the apertures 31 so as to crystallise the semiconductor film 1 both at the apertures 31 and under the masking stripes 32 (FIG. 5). The masking stripes 32 serve (at least to some extent) to mask against the area of the beam 50 incident thereon.

In accordance with the present invention this method is characterised by so patterning the grid 30 in step (b) as to locate the masking stripes 32 over areas of the semiconductor film 1 where channel regions 11 of the TFT are to be formed and to give each aperture 31 between the masking stripes 32 a width S1 of less than the wavelength A of the energy beam 50 of step (c) so as to crystallise the whole length of the channel region 11 below each masking stripe 32 by diffraction of the energy beam 50 at the apertures and by thermal diffusion from the areas heated by the energy beam 50, (d) implanting dopant ions 40 characteristic of one conductivity type in the semiconductor film 1 at the apertures 31 in the grid 30 while using the masking stripes 32 to mask underlying areas of the semiconductor film against implantation of the dopant ions 40 (FIG. 4), the implanted dopant ions 40 in the semiconductor film 1 providing a conductivity type dopant concentration for source and drain regions 12 and 13 and intermediate conductive regions 14 of the TFT, and (e) retaining at least part of the grid 30 of masking stripes 32 on the insulating film 2 as an insulated gate structure of the TFT.

Such a method in accordance with the present invention simplifies the manufacturing process by combining steps for crystallising the semiconductor film 1 and for forming the TFT structure. Furthermore, the process for crystallising the semiconductor film 1 is rendered more efficient by appropriate choice of material and the dimensions of the grid 30, its apertures 31 and masking stripes 32. Preferably, the energy beam 50 is of ultraviolet wavelength from a pulsed excimer laser, for example a wavelength of 248 nm from a KrF laser, or a wavelength of 308 nm from a XeCl laser or a wavelength of 351 nm from a XeF laser. In such a case, the masking grid 30 may be formed with each aperture 31 having a width S1 of less than about 0.3 $\mu$m and with each masking stripe between the apertures 31 having a width S2 in the range of about 0.3 $\mu$m to about 0.7 $\mu$m. Preferably, the width S2 of each masking stripe 32 between the apertures 31 is larger than the wavelength $\lambda$ of the beam 50, so as to avoid interference effects from neighbouring apertures 31.

Figure 6A:
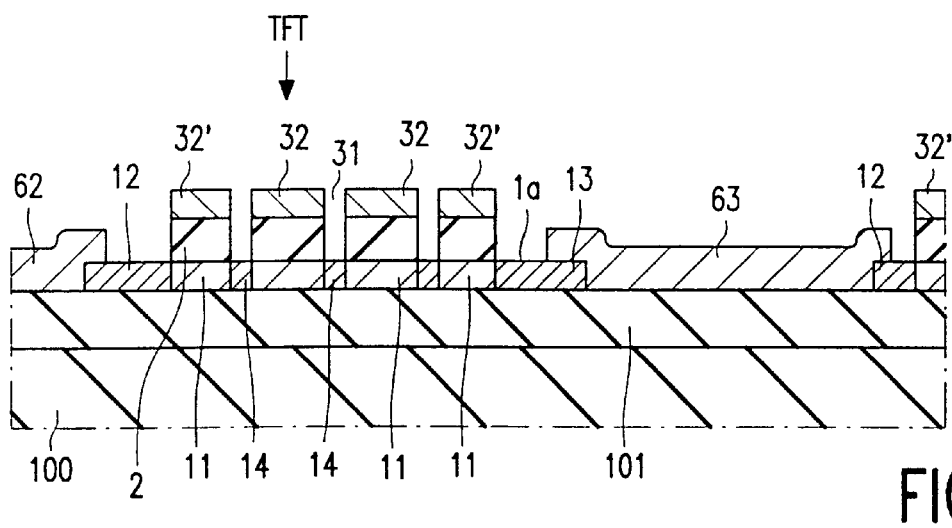
Figure 6B:
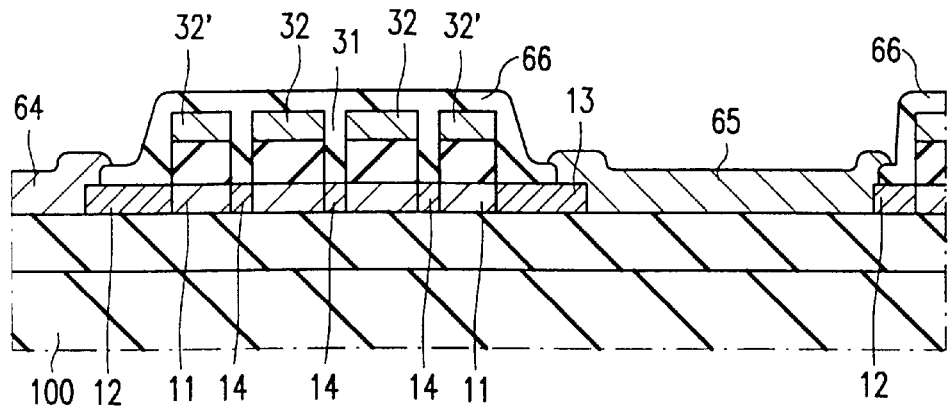

The TFTs are of the so-called "self-aligned" type, in which the channel regions 11 and the implanted source and drain regions 12 and 13 and intermediate regions 14 are formed side-by-side in the semiconductor film 1, see FIGS. 6a and 6b. The channel regions 11 of these TFTs are of high-mobility polycrystalline material formed by the crystal growth process of FIG. 5. Apart from the dimensioning and use of the masking grid 30 in steps (a) to (c), the process parameters for forming the TFTs may be similar to those described in the Optoelectronics paper by J R Ayres et al, as regards film deposition, laser crystallisation, ion implantation, metallisation and hydrogenation. The TFTs described in the Optoelectronics paper have a single gate electrode which is not divided into stripes 32. However, as already noted, it is known from, for example, the IEE Proc Circuits Devices Systems paper by J R Ayres et al to divide the gate of a self-aligned poly-silicon TFT into a number of fingers, for example six fingers each of 6 $\mu$m width. The TFT fabricated in accordance with the present invention has a multi-fingered gate structure which is also designed for the laser crystallisation of the semiconductor film and which typically has a larger number of fingers 32 of smaller widths than those described in the IEE Proc Circuits Devices Systems paper. Thus, for example, a TFT manufactured in accordance with the present invention having a total channel length of 5 $\mu$m may typically comprise 10 or more masking stripes 32 as its gate fingers.

The large-area electronic device being manufactured by the method of FIGS. 1 to 7 may comprise, for example, a flat panel display having a thin-film cell matrix similar to that described in U.S. Pat. No. 5,130,829 and having integrated thin-film drive circuitry on the same substrate 100,101. The TFTs of FIGS. 6a and 6b may form part of this drive circuitry. Alternatively, the device may comprise a large-area image sensor or a data store or a memory device. The device substrate 100,101 is typically electrically insulating at least at its upper surface where the thin-film circuitry is formed. The substrate 100,101 may comprise a glass plate 100 of this device. The glass plate 100 may be capped with an insulating film 101 on which the thin-film circuit structure is fabricated. Typically, the capping film 101 may be of silicon oxide having a thickness of about 0.5 $\mu$m or less.

FIG. 1 illustrates the deposition of an amorphous or micro-crystalline silicon semiconductor film 1 on the capping layer 101 of the substrate 100,101. The amorphous silicon film may be deposited by plasma-enhanced chemical vapour deposition (PECVD) or by low-pressure chemical vapour deposition (LPCVD) in known manner. Typically, the resultant silicon film 1 has a hydrogen content, i.e it is generally known as $\alpha$-Si:H. The thickness Z of the silicon film 1 is typically about 0.1 $\mu$m or less, for example about 0.05 $\mu$m. Using a known photolithographic and etching process, the silicon film 1 is then patterned into separate islands such as islands 1a and 1b for the separate TFTs. Thus, the island 1a accommodates all the channel regions 11 of one TFT formed therewith.

Figure 2:
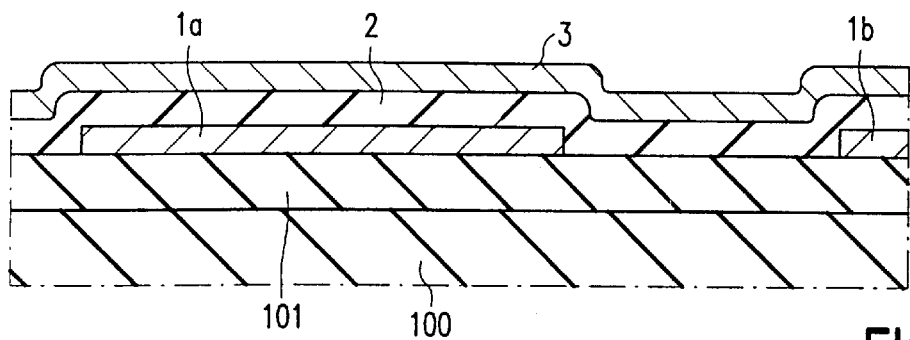

FIG. 2 illustrates a subsequent stage in which the insulating film 2 and masking film 3 are deposited. The materials and thicknesses chosen for the films 2 and 3 are consistent with the intended use of the masking grid 30 to provide the insulated gate structure of the TFT. In a typical example, the insulating film 2 may be of silicon oxide having a thickness z of about 0.15 $\mu$m, and the masking film 3 may be of amorphous silicon having a thickness of about 0.1 $\mu$m. Alternatively the stripes 32 may be of a metal, for example chromium having a thickness of about 0.05 $\mu$m.

Figure 3:
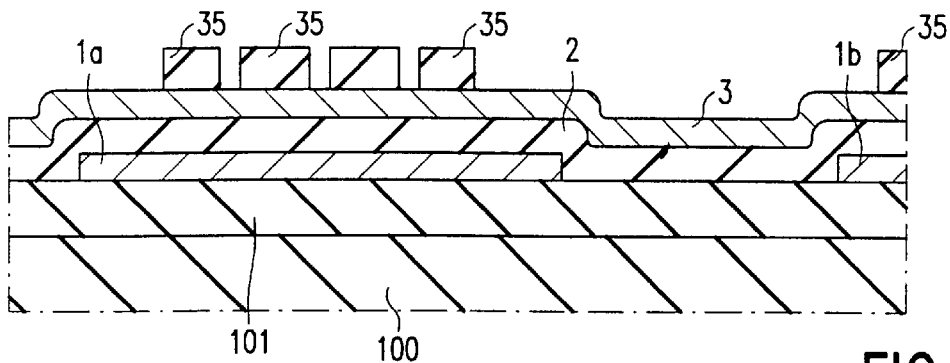

The masking grid 30 is now formed using photolithographic and etching steps. Because of the small width S1 of the apertures 31, the photolithography may be carried out with a deep ultra-violet wavelength or with an electron beam or with x-ray lithography. Thus, either as a photoresist or as an electron resist, a lithographic resist pattern 35 is formed on the areas of the masking film 3 where the masking stripes 32 are to be defined. This lithographic resist pattern 35 is illustrated in FIG. 3. The pattern 35 is now used as an etchant mask for defining the desired grid structure in the masking film 3. An anisotropic etching process (for example reactive ion etching) is used, in view of the small width S1 of the apertures 31. The etching process is preferably continued through the thickness of the insulating film 2, although in some embodiments of the present invention the film 2 may be retained as a continuous film through the process steps of FIGS. 4 and 5.

FIG. 4 illustrates the dopant ion implantation step (d) in which a beam of dopant ions 40 is directed towards the thin film structure. In the case of an n-channel TFT, these dopant ions 40 may be of, for example, phosphorous. The dopant ions 40 incident on the masking stripes 32 are absorbed therein, and so do not penetrate into the insulating film 2 or the underlying areas of the semiconductor film 1. If the thickness of the masking stripes 32 is insufficient to stop the dopant ions 40, the lithographic resist pattern 35 may be retained on the masking stripes 31 as part of the implantation mask during the process step of FIG. 4. Thus, the resist pattern 35 is shown in broken outline as an optional feature in FIG. 4. The resist pattern 35 is removed before the crystal growth step (c) of FIG. 5. However, because an implanted resist pattern can be difficult to remove, it is preferable to remove the resist pattern 35 before the implantation step of FIG. 4 and to use a sufficiently thick masking stripe 32 as the implantation mask. At the stage illustrated in FIG. 4, the semiconductor film 1 is still of amorphous silicon material, both at the apertures 31 and below the masking stripes 32.

FIG. 5 illustrates a laser treatment in accordance with the present invention in which a laser beam 50 is used both for crystal growth of the semiconductor material 1 and for annealing (and so activating) the implanted dopant ions 40 in the semiconductor material 1. Beam 50 may be of an ultraviolet wavelength $\lambda$ of, for example, 248 nm from a pulsed KrF excimer laser. The parallel light beam 50 is incident as a plane wavefront on the grid 30. Masking stripes 32 of amorphous silicon absorb this laser wavelength, whereas masking stripes 32 of chromium can be about 50% absorbing and 50% reflective of this laser wavelength. Thus, in the areas of these masking stripes 32 the laser light is absorbed and/or reflected as indicated by the double arrows 51. The laser light 50 is transmitted at the apertures 31. However, because the width S1 of these apertures 31 is less than the wavelength $\lambda$ of the laser light 50, the laser light 50 is diffracted into the silicon film 1 as radially cylindrical wavefronts. An enlarged schematic of this situation is illustrated in FIG. 8.

Figure 8:
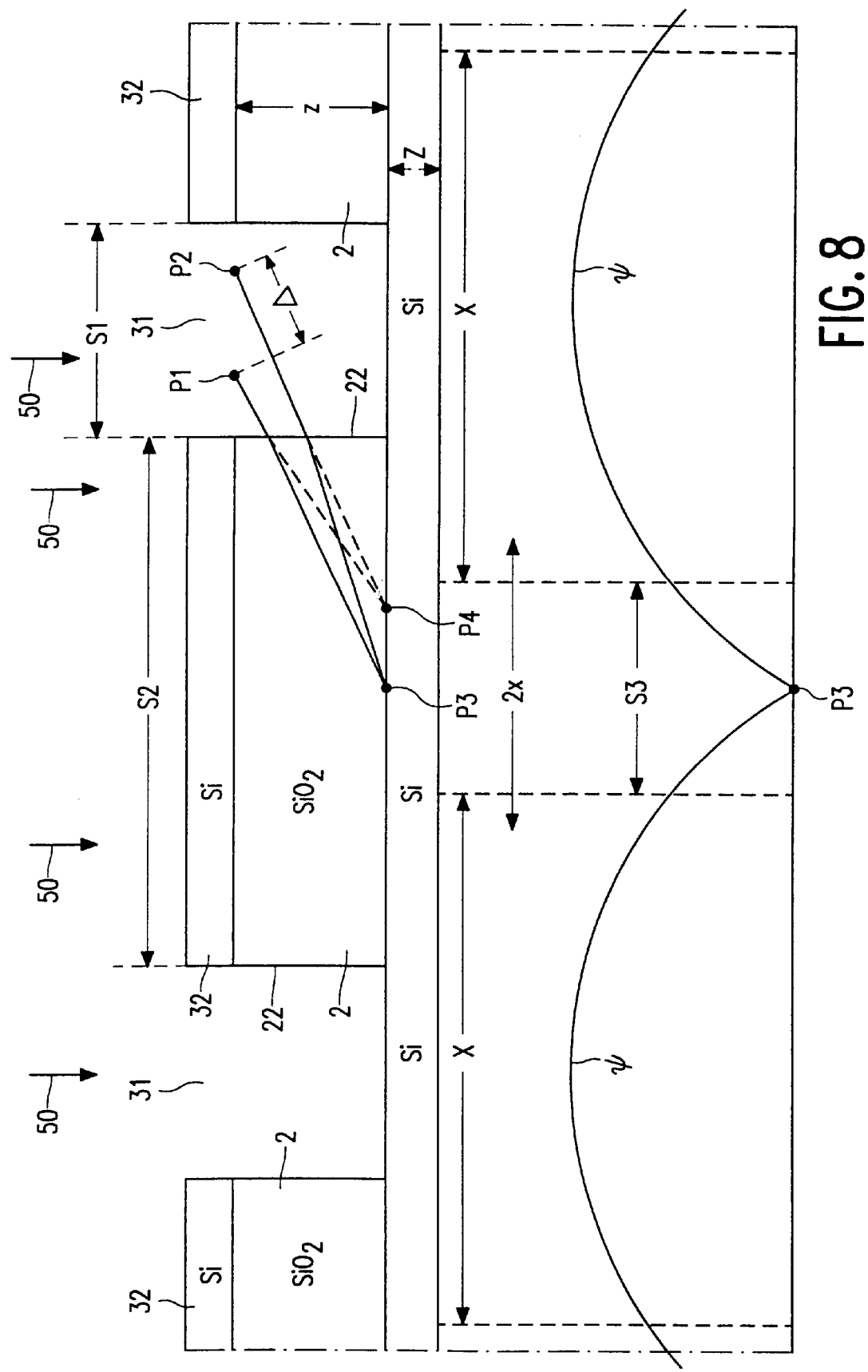
FIG. 8 is a simplified and enlarged schematic of the laser annealing step of FIG. 5.

FIG. 8 shows two points P1 and P2 on the plane wavefront at a given aperture 31 between masking stripes 32. By the Huygens Principle each point on this plane wavefront can be regarded as a new source of waves spreading out radially from that point. Diffraction of the laser light to the area under the masking stripes can be regarded as the result of the interference of these new waves from each of the point sources at the given aperture 31. The first minimum in the interface pattern from the two sources P1 and P2 at the given aperture 31 occurs at a point P3 on the film 1 where the difference A in the path lengths P1 to P3 and P2 to P3 is $\lambda/2$ (half a wavelength). The curve P below the schematic thin-film structure in FIG. 8 illustrates the fall-off in the diffracted light intensity from the given aperture 31 along the length of the semiconductor film 1 below the masking stripe 32. The distance X in FIG. 8 indicates the distance over which the diffractive peak of light from the aperture 31 is spread along the semiconductor film 1 from the aperture 31. The diffracted peak refers to the laser light intensity in the film 1 above an intensity threshold for melting the semiconductor material when absorbed therein. The silicon film 1 is melted in the area over which the diffracted peak penetrates and is absorbed.

The angular spread of the diffracted peak beyond the aperture 31 increases in magnitude as the width S1 of the aperture 31 is reduced. The maximum intensity of light transmitted by the aperture 31 reduces however as the width S1 of the aperture 31 is reduced, the limit being determined by the intensity threshold for melting the semiconductor material of the film 1. FIG. 8 illustrates an approximately optimum situation in which the width S1 is about 0.8$\lambda$.

It should also be noted in the situation of FIG. 8 that the insulating film 2 is transmissive of the diffractive wavefront and so the spread X of the diffractive peak at the aperture 31 is elongated by refraction at the side-wall 22 of the insulating film 2 in the aperture 31. In the absence of this refraction, the first minimum in the interference pattern from the two point sources P1 and P2 would occur at point P4 instead of point P3. Therefore, the refractive index (for example about 1.5) of this insulating film 2 serves to increase the spread X of the diffracted peak along the length of the semiconductor film 1. Thus, both the diffraction at the narrow aperture 31 and the refraction by the insulating film 2 spreads the diffracted peak from the edge of the aperture 31 over a distance (X−S1)/2 under the masking stripe 32. In practice it is found that with the materials and film thicknesses desirable for a TFT insulated gate structure and with an optimum width S1 for the diffraction aperture 31, the distance (X−S1)/2 is comparable to the thickness z of the insulating film 2.

Heat flow in the silicon film 1 occurs over a heat diffusion length which is about 0.3 $\mu$m, when using a pulsed beam 50 with a pulse duration of about 10 ns (nanoseconds). The fraction of this distance over which the temperature is sufficiently high to maintain a melt in the silicon material is about 0.1 $\mu$m, this distance being known as the melt length x. With a laser pulse of about 10 ns the duration of the melt condition in the silicon film 1 is of the order of 100 ns. The thickness Z of the silicon film 1 is less than the melt length x. FIG. 8 illustrates the situation in which the diffracted light peaks from neighbouring apertures 31 do not meet each other under the stripes 32 but are separated by a distance S3. However, sufficient heat flow from the areas X to crystallise rapidly the intermediate silicon area over this distance S3 can still occur when the distance S3 is about twice the melt length x, or less. In this situation, in order to ensure good crystallisation of the whole length of the film 1 below each masking stripe 32 during the melt duration time, the width S2 of the masking stripe 32 between two diffraction apertures 31 should preferably be less than (X+2x−S1). In the particular example of FIGS. 1 to 7, diffraction apertures 31 are not present (between stripes 32) over the areas of the film 1 where the source and drain regions 12 and 13 are formed. In this example, it is desirable to narrow the first and last stripes 32' (which are between an intermediate region 14 and a source or drain region 12 or 13) to have a width of less than 2x+(X−S1)/2.

When the masking stripes 32 are of semiconductor material which absorbs the area of the beam 50 incident thereon, then at least the upper part of the stripes 32 may be melted by the beam 50, and there will be heat diffusion from the stripes 32 across the insulating film 2 to the underlying areas of the semiconductor film 1. The thickness z of the film 2 is of the order of a thermal diffusion length in the material of film 2. This heat diffusion from the stripes 32 may by itself raise the temperature of the underlying areas of the semiconductor film 1 to above 600° C. Thus, although the diffracted light peaks from neighbouring apertures 31 may not meet each other under the stripes 32, heat flow to the remaining area under the stripes 32 occurs by heat diffusion from the melted areas in the film 1 and possibly also from melted areas of the stripes 32. In this scenario the crystal growth from neighbouring apertures 31 crystallises the whole area of the film 1 below the masking stripe 32 during the very short duration of the laser pulse.

In practice it is found that with the materials and dimensions typically used for the TFT, the width S2 of masking stripes 32 between diffraction apertures 31 is larger than the wavelength $\lambda$ and less than 3$\lambda$, where $\lambda$ is the wavelength of the energy beam 50.

In a specific example of the laser crystallisation treatment of FIGS. 5 and 8, a 248 nm wavelength from a pulsed KrF laser may be used, with an incident laser energy on the grid 30 in the range of 100 to 300 mJ.cm$^{-1}$ per pulse. The laser pulse duration may be of the order of 10 nanoseconds. A single pulse exposure could be used for crystallisation of the film 1, or exposure to multiple pulses (for example, 5 or 10 such pulses) may be used. With the specific example of materials and thicknesses previously given for the films 1 and 2, the width S1 of the apertures 31 between the masking stripes 32 may be about 0.2 $\mu$m, and the width S2 of the masking stripes 32 between the apertures 31 may be about 0.5 $\mu$m. The width of the first and last stripes 32' between the source and drain areas and an aperture 31 may be about 0.3 $\mu$m. With these dimensions for the masking grid 30 in this laser treatment, the amorphous silicon material of the film 1 is converted to polycrystalline silicon material, typically with a crystal grain size of 0.1 to 0.3 $\mu$m. The electron field-effect mobility through this polycrystalline material in n-channel TFTs may be typically, for example, in the range of 50–200 cm$^2$.V$^{-1}$.s$^{-1}$. The laser treatment also anneals and activates the phosphorous ion implant so as to form the source and drain regions 12 and 13 of the TFT and the intermediate n-type regions 14 between the channel regions 11 of the TFT. Surprisingly, there is at most very little movement of the implanted dopant by thermal diffusion during the laser anneal treatment. In most instances no dopant diffusion seems detectable in this treatment.

Figure 7:
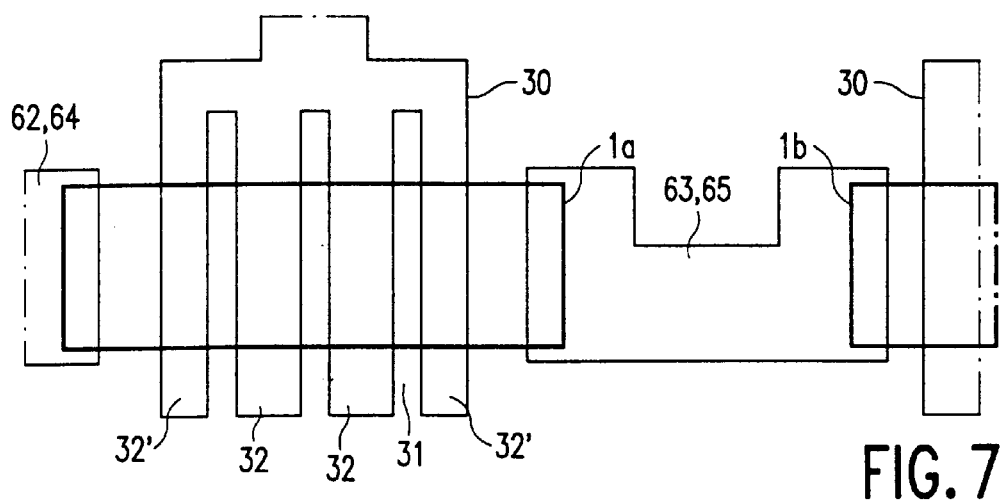
FIG. 7 is a plan view of part of the thin-film device structure of FIGS. 6a and 6b showing the semiconductor island pattern, the source and drain metallisation pattern and the masking-grid insulated-gate pattern of the TFT.

FIGS. 6a and 6b show two alternative forms of the stage in which a metallisation film pattern is provided to form the electrode connections to the source and drain regions 12 and 13. Parts of this metallisation pattern also form interconnections on the substrate 100,101, for example to the gate electrode 32 of the TFT. In the form shown in FIG. 6a, the metallisation pattern 62,63 is of a metal which can be selectively etched with respect to the grid pattern 32 forming the gate electrodes of the TFT. Thus, for example, when the gate pattern 32 is of silicon or chromium, the source and drain and interconnect metallisation pattern 62,63 may be of aluminium. FIG. 6b illustrates a modified structure in which the source, drain and interconnect metallisation 64,65 contacts the TFT structure at windows in an insulating film pattern 66. In this case, after the laser treatment of FIG. 5, an insulating film is deposited on the thin-film structure on the substrate 100,101. Contact windows are then etched in the film 66, after which a metallisation film is deposited. The metallisation film is then patterned by etching into the desired electrode and interconnect pattern 64,65. In this case, both the grid 32 and the pattern 64,65 may be of the same material, for example aluminium. FIG. 7 illustrates the resulting layout pattern of the metallisations 32 and 64,65 on and around the silicon islands 1a and 1b.

The TFT structures fabricated in this manner are now hydrogenated in known manner to passivate grain boundaries in the crystallised silicon islands 1a,1b etc. The hydrogenation may be effected by exposing the devices at 350° C. to a hydrogen plasma as described in the Optoelectronics and IEE Proc Circuits, Devices, Systems papers by J R Ayres et al. Alternatively, the hydrogenation may be effected by baking in a hydrogen atmosphere. The apertures 31 in the gate structure 32 aid the penetration of hydrogen into and through all the channel regions 11 of the TFT.

Figure 9:
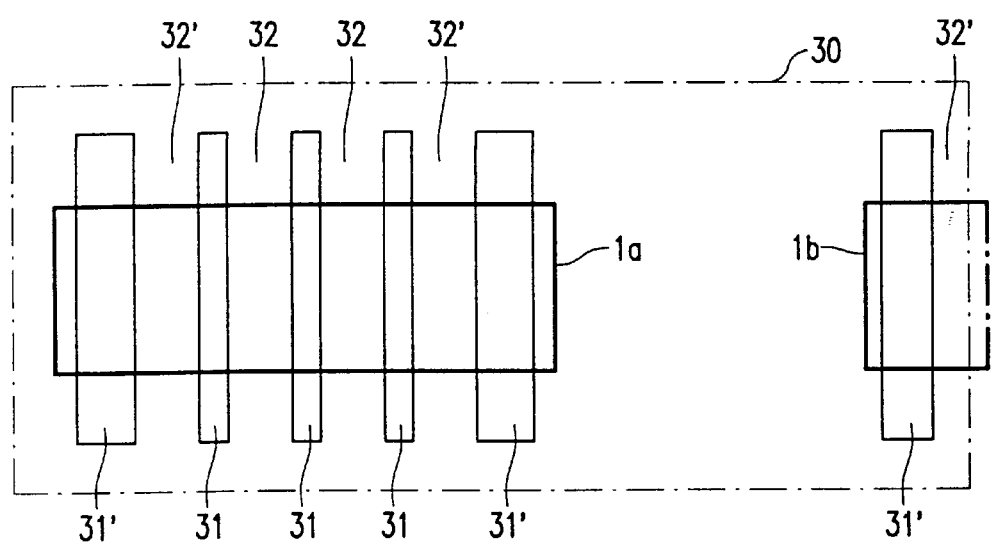
FIGS. 9 and 10 are respective plan and cross-sectional views of the thin-film structure at the FIGS. 4 and 5 stages, showing a modified masking-grid pattern which may be used in accordance with the present invention.
Figure 10:
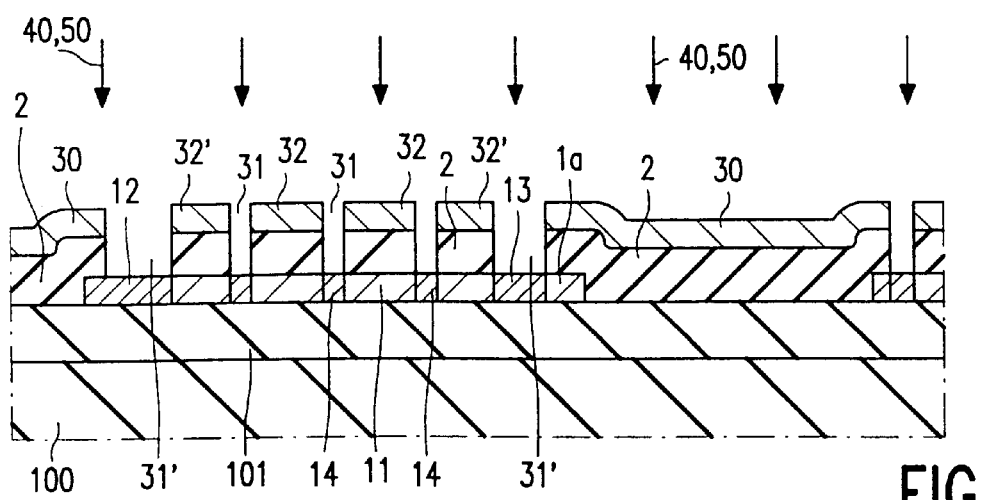

It will be evident that many modifications and variations are possible within the scope of the present invention. In the method of FIGS. 1 to 7, the pattern of the masking grid 30 may be identical to that of the insulated gate pattern of the final TFT structure as shown in FIG. 7. In this case, the whole of the grid 30 of masking stripes 32 is retained on the insulating film 2 as the insulated gate structure of the TFT. FIGS. 9 and 10 illustrate a modification in which the grid 30 is part of a large area mask on the thin-film structure on the substrate 100,101 during the implantation stage of FIG. 4 and the laser treatment stage of FIG. 5.

In this example of FIGS. 9 and 10, the whole of the upper face of the thin-film structure and substrate 100,101 is covered with the masking film 30 except at the apertures 31 corresponding to the intermediate regions 14 of the TFT and apertures 31' corresponding to the source and drain regions 12 and 13 of the TFT. During the ion implantation step of FIG. 4, this large area mask may be connected to ground. An advantage of this arrangement is that the bombarding ions 40 in the areas outside the apertures 31 can be safely discharged to ground, without any risk of electrostatic damage to the thin-film structure on the insulating substrate 100,101. Except where the silicon film 1 is exposed at the apertures 31, the large area mask 30 of FIGS. 9 and 10 may also serve to shield the thin-film structure on the substrate 100,101 from exposure to the laser beam 50 in the FIG. 5 stage.

The source and drain apertures 31' in the large area mask of FIGS. 9 and 10 may be wider than the intermediate apertures 31, i.e wider than the wavelength of the beam 50. In this case (as in FIGS. 4 to 7), the first and last stripes 32' should be narrower than the stripes 32 to ensure crystallisation of the underlying areas of the film 1 adjacent to the source and drain regions 12 and 13. However, the apertures 31' in the large area mask of FIGS. 9 and 10 may be of the same narrow width S1 as the apertures 31 between the masking stripes 32, in which case the first and last stripes 32' may be of the same width S2 as the stripes 32 between the apertures 31. In this case, crystallisation of the underlying areas of the film 1 adjacent to the source and drain regions 12 and 13 is ensured by diffraction at both the apertures 31 and 31' as well as by the heat diffusion. In this case, after removing areas of the large area mask 31 covering the source and drain end portions of the silicon islands 1a and 1b, a second dopant ion implantation step and subsequent annealing step can be carried out to provide sufficiently wide source and drain region areas for contact with the source and drain metallisation 64 and 65.

In the embodiments so far described with reference to FIGS. 1 to 10, the channel regions 11 of the silicon film 1 were masked against the area of the laser beam 50 incident on the masking stripes 32. These stripes 32 of, for example, silicon, chromium or aluminium were not all transmissive of the laser beam 50. However, the invention may also be used with advantage in situations where the stripes 32 are partially transmissive of the beam 50, for example when using stripes 32 of ITO and a beam 50 of a larger wavelength. Light diffraction at the apertures 31 as well as heat diffusion in the film 1 can aid crystallisation of these film areas underlying the stripes 32 where the intensity of the directly incident beam 50 is reduced by the stripes 32 being only partially transmissive.

In the embodiments so far described, the substrate 100, 101 comprises a glass plate 100. However, the present invention may be used with substrates of polymer material. In this case, in order to mask the polymer substrate 100 from the laser beam 50, it is advantageous to sandwich a masking film (for example of amorphous silicon) between two thick capping insulating layers 101.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

I claim:

1. A method of manufacturing an electronic device comprising a thin-film transistor, the method including the steps of:
   (a) depositing sequentially on a substrate a semiconductor film, an insulating film and a masking film,
   (b) patterning the masking film to form a grid of masking stripes having apertures over the semiconductor film,
   (c) directing an energy beam towards the grid and its apertures to heat the semiconductor film with the area of the energy beam at the apertures and so to crystallise the semiconductor film both at the apertures and under the masking stripes,
   which method is characterised by so patterning the grid in step (b) as to locate the masking stripes over areas of the semiconductor film where channel regions of the thin-film transistor are to be formed and to give each aperture between the masking stripes a width of less than the wavelength of the energy beam of step (c) so as to crystallise the channel region below each masking stripe by diffraction of the energy beam at the apertures and by thermal diffusion from the areas heated by the energy beam,
   (d) implanting dopant ions characteristic of one conductivity type in the semiconductor film at the apertures in the grid while using the masking stripes to mask underlying areas of the semiconductor film against implantation of the dopant ions, the implanted dopant ions in the semiconductor film providing a conductivity type determining dopant concentration for source and drain regions and intermediate conductive regions of the thin-film transistor, and
   (e) retaining at least part of the grid of masking stripes on the insulating film as an insulated gate structure of the thin-film transistor.

2. A method as claimed in claim 1, further characterised in that the implantation step (d) is carried out before the crystal growth step (c), the energy beam serving to anneal the implanted dopant concentration at the apertures as well as crystallising the semiconductor film both at the apertures and under the masking stripes.

3. A method as claimed in claim 2, further characterised in that the grid is formed using photolithographic and etching steps with a lithographic resist pattern on the areas of the masking stripes, the lithographic resist pattern is present on the masking stripes as part of the implantation mask during step (d), and the lithographic resist pattern is removed before the crystal growth step (c).

4. A method as claimed in claim 1, further characterised in that the insulating film is removed from the apertures of the grid before the crystal growth and implantation steps (c) and (d).

5. A method as claimed in claim 1, further characterised in that in step (b) each masking stripe between the apertures is formed with a width which is larger than $\lambda$ and less than $3\lambda$, where:
   $\lambda$=the wavelength of the energy beam in step (c).

6. A method as claimed in claim 1, further characterised in that the masking stripes comprise semiconductor material which absorbs the energy beam incident thereon.

7. A method as claimed in claim 1, further characterised in that the masking stripes are of a metal which at least partly reflects the energy beam incident thereon.

8. A method as claimed in claim 1, further characterised in that a hydrogenation process is carried out after the crystal growth and implantation steps (c) and (d) so as to introduce hydrogen into the channel areas of the semiconductor film via the apertures of the grid.

9. A method as claimed in claim 1, further characterised in that before depositing the masking film the semiconductor film is patterned into separate semiconductor islands, one of the islands accommodating all the channel regions of the said thin-film transistor.

10. A method as claimed in claim 1, further characterised in that the energy beam is of an ultraviolet wavelength from an excimer laser and in that the grid is formed in step (b) with each aperture having a width of less than 0.3 $\mu$m (micrometer) and with each masking stripe between the apertures having a width in the range of 0.3 $\mu$m to 0.7 $\mu$m.

* * * * *